United States Patent [19]
Afek et al.

[11] Patent Number: 5,631,589
[45] Date of Patent: May 20, 1997

[54] TRANSITION CONTROL CIRCUIT FOR DRIVER CIRCUITS

[75] Inventors: Yachin Afek, Kfar Saba; Claudine Tordjman, Holon; Ricardo Berger, Raanana, all of Israel

[73] Assignee: Motorola, Inc., Schaumburg, Ill.

[21] Appl. No.: 324,073

[22] Filed: Oct. 14, 1994

[30] Foreign Application Priority Data

Oct. 16, 1993 [GB] United Kingdom ............ 9321396

[51] Int. Cl.$^6$ ............................................. H03B 1/00
[52] U.S. Cl. ................................. 327/108; 327/374
[58] Field of Search ................................ 326/82, 83, 84, 326/85, 86, 87, 89, 90, 91; 327/108–112, 374, 376, 377

[56] References Cited

U.S. PATENT DOCUMENTS

| | | | |
|---|---|---|---|
| 4,477,741 | 10/1984 | Moser, Jr. ............................ | 307/473 |
| 4,731,553 | 3/1988 | Van Lehn et al. ................... | 307/443 |
| 4,928,023 | 5/1990 | Marshall .............................. | 307/443 |
| 5,149,991 | 9/1992 | Rogers ................................ | 307/443 |
| 5,332,932 | 7/1994 | Runaldue ............................ | 307/443 |

*Primary Examiner*—Timothy P. Callahan
*Assistant Examiner*—Jeffrey Zweizig
*Attorney, Agent, or Firm*—Vincent B. Ingrassia; Harry A. Wolin; Rennie William Dover

[57] ABSTRACT

A transition control circuit (2) for controlling the transitions of an output signal, at an output node (8) of a driver circuit, in dependence on the logic state of an input signal at an input node (10). The output signal being switchable between a first logic state and a second logic state. The transition control circuit (2) comprises first means (16) and second means (14). The first means (16) is enabled when the output signal has the first logic state and the input signal has the second logic state, and is disabled when the output signal has the second logic state or the input signal has the first logic state. Once enabled, the first means (16) couples the output node (8) to a first supply line (GNDA) whereby the output signal switches to the second logic state. The second means (14) is enabled when the output signal has the second logic state and the input signal has the second logic state, and is disabled when the output signal has the first logic state or the input signal has the first logic state. Once enabled, the second means (14) couples the output node to a second supply line (GNDB) whereby the output signal is held in the second logic state until the next transition of the input signal.

17 Claims, 6 Drawing Sheets

TRANSITION CONTROL CIRCUIT FOR DRIVER CIRCUITS

This invention relates to a transition control circuit for controlling the transitions of a signal at an output node of a driver circuit.

BACKGROUND OF THE INVENTION

A typical driver circuit for driving a capacitive load is shown in FIG. 1. The driver circuit comprises a pre-driver circuit, N-channel and P-channel drive transistors and an off-chip capacitive load. The pre-driver circuit supplies the enable signals ENN and ENP for the N-channel and P-channel drive transistors, respectively. An inductance on the output pin, which couples to the capacitive load, is an inherent feature of this arrangement and may extend to 15 nH for low cost packages.

On fast transitions of the input signal and hence the output signal, particularly when the output pin goes from a high logic state (VDD) to a low logic state (GND), the ground pin GND is required to supply a current spike to discharge the capacitive load, as shown in FIG. 3. However, due to the inductance on the output pin, the signal on the ground pin GND follows the enable signal ENN of the N-channel drive transistor. The spike then decays and oscillates, due to the LC circuit formed by the load capacitor and the pin inductance, with a typical period of, $$2 X \pi X \sqrt{LXC_{load}}$$

Where L is the inherent inductance on the input pin and $C_{load}$ is the capacitance of the load.

The oscillations may be greater than the voltage level Vol which represents the amplitude of the maximum voltage recognized as a logic '0', or '1' depending on the logic convention implemented. This causes a greater delay in the completion of the transition from the high logic state to the low logic state. In some cases, an oscillation which exceeds Vol can be detected as a double transition by the 'driven' circuit, thereby producing incorrect results and errors.

A few methods have been developed to address the problems described above. One method, known as gradual switching, involves splitting the driver circuit into sections, such that each section turns on, one after the other. Such a method avoids the generation of spikes, but slows down the transition of the output signal.

Another technique involves adding resistances in the charge/discharge path of the driver circuits. In most cases, the resistance is added in the output path of the driver circuit. In some cases, it is done in the enable path or the supply path. However, this technique also slows down the transition.

Thus, the known methods provide a solution at the expense of transition speed. It is therefore desirable to provide a circuit which addresses the problems described above without compromising the transition speed.

SUMMARY OF THE INVENTION

In accordance with a first aspect of the present invention there is provided a transition control circuit for controlling the transitions of a signal at an output node of a driver circuit, the transition control circuit comprising:

an input node for receiving an input signal having a first logic state or a second logic state, the output signal at the output node being switchable between the first logic state and the second logic state in dependence on the logic state of the input signal;

first means coupled to the output node and the input node and being enabled when the output signal has the first logic state and the input signal has the second logic state, and being disabled when the output signal has the second logic state or the input signal has the first logic state, the first means once enabled coupling the output node to a first supply line such that the output signal at the output node switches to the second logic state when the voltage at the output node reaches a predetermined level; and second means coupled to the output node and the input node and being enabled when the output signal has the second logic state and the input signal has the second logic state, and being disabled when the output signal has the first logic state or the input signal has the first logic state, the second means once enabled coupling the output node to a second supply line such that the output signal is held in the second logic state until the next transition of the input signal.

The transition control circuit in accordance with the first aspect of the invention thus ensures that after a transition from a high logic state to a low logic state, the output signal is isolated from the first supply line and is held in the logic low state by the second means until the next transition. Furthermore, the transition control circuit in accordance with the invention achieves spike immunity without compromising the transition speed, since no extra components in the charge/discharge path are required.

In accordance with a second aspect of the invention there is provided a transition control circuit for controlling the transitions of a signal at an output node of a driver circuit, the transition control circuit comprising:

an input node for receiving an input signal having a first logic state or a second logic state, the output signal at the output node being switchable between the first logic state and the second logic state in dependence on the logic state of the input signal;

first means coupled to the output node and the input node and being enabled when the output signal has the first logic state and the input signal has the second logic state, and being disabled when the output signal has the second logic state or the input signal has the first logic state, the first means once enabled coupling the output node to a first supply line such that the output signal at the output node switches to the second logic state when the voltage at the output node reaches a predetermined level; and second means coupled to the output node, the input node and the first supply line, and being enabled when the input signal has the second logic state and being disabled when the input signal has the first logic state, the second means comprising resistive means coupled between the output node and the first supply line, the second means coupling the output node to the first supply line via the resistive means when the second means is enabled and the first means is disabled, such that the output signal is held in the second logic state until the next transition of the input signal.

In a preferred arrangement the resistive means comprises a resistor coupled between the output node and the first supply line. However, other oscillation absorbing resistive means, such as a small transistor, may be used.

The transition control circuit in accordance with the second aspect of the invention thus ensures that after a transition from a high logic state to a low logic state, the output signal is held in the logic low state by the second means by way of the damping action of the resistive means until the next transition. Furthermore, the transition control circuit in accordance with the present invention achieves spike immunity without compromising the transition speed, since no extra components in the charge/discharge path are required.

A number of applications require the use of a plurality of driver circuits. FIG. 2 shows a bus configured arrangement of a plurality of driver circuits. The arrangement comprises n driver circuits sharing common supply lines via a pin pair (GND and VDD), where n is the bus width.

For those driver circuits whose output signal has the low logic state before the high-to-low transition, the output signal should remain low after the transition. Since the driver circuits are all coupled to the same ground pin GND, the spike which is produced for a driver circuit whose output signal switches from high to low, produces a spurious spike in the output signals of the non-transient driver circuits (see FIG. 4). Such spurious spikes may be detected by the receiving circuits so as to produce erroneous results.

A transition control circuit in accordance with the first aspect of the present invention may be implemented in each of the plurality of driver circuits, the plurality of driver circuits having common first, second and third supply lines. The transition control circuit in accordance with the first aspect of the present invention ensures that the output signal of a non-transient driver circuit does not have any spikes, by connecting the output to the second supply line which supplies a substantially constant voltage signal, such that the output is isolated from the common first supply line. In addition, the transition control circuit in accordance with the present invention overcomes the oscillation problems of the prior art driver circuits. For an arrangement comprising n driver circuits, the period of oscillation becomes, $$2X\pi X \sqrt{LXnXC_{load}}$$

A transition control circuit in accordance with the second aspect of the present invention may be implemented in each of the plurality of driver circuits, the plurality of driver circuits having common first and second supply lines. The transition control circuit in accordance with the second aspect of the present invention ensures that the output signal of a non-transient driver circuit has a single spike only and overcomes the oscillation problems of the prior art driver circuits, by connecting the output to the first supply line via resistive means after a transition from a high logic state to a low logic state.

BRIEF DESCRIPTION OF THE DRAWINGS

A preferred embodiment of the present invention will now be described with reference to the accompanying drawings in which.

DETAILED DESCRIPTION OF THE DRAWINGS

Figure 5:
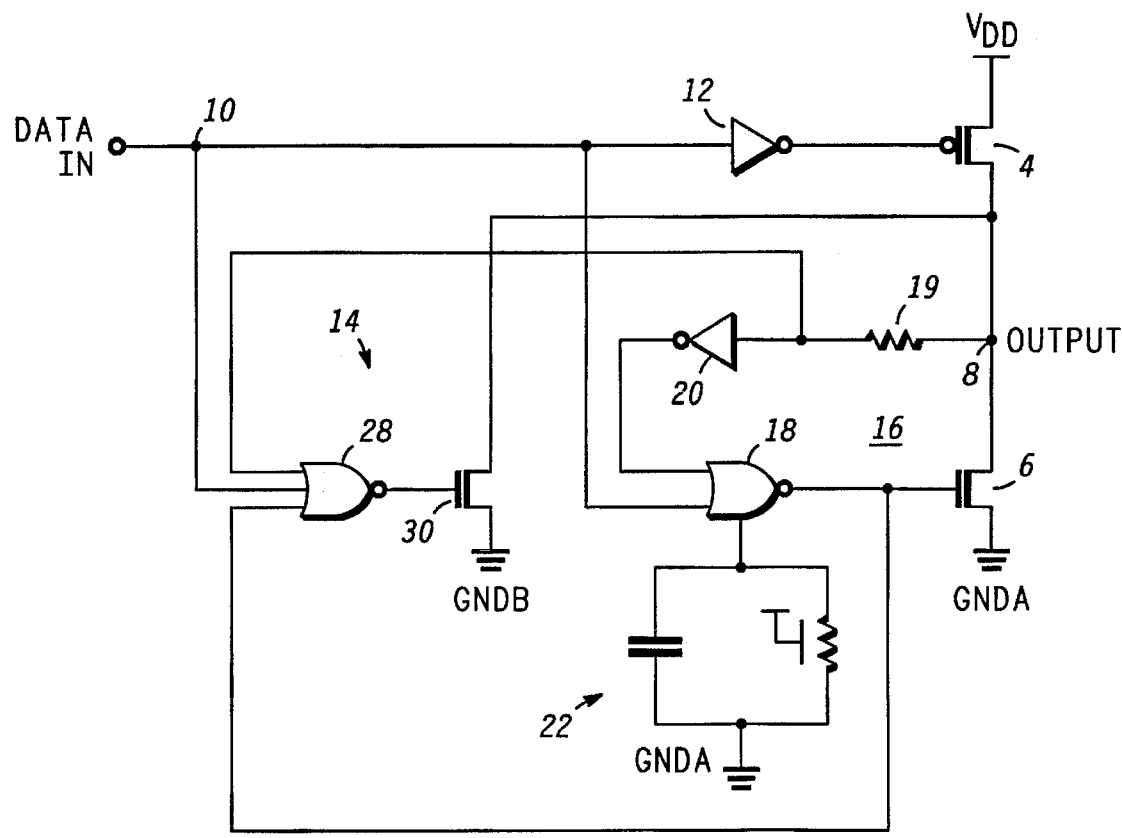
FIG. 5 is a block schematic diagram of a transition control circuit in accordance with a first embodiment of the present invention.

Referring to FIG. 5, a transition control circuit 2, in accordance with a first embodiment of the invention, controls the transitions of an output signal at an output node 8 of a driver circuit, which comprises a P-channel drive transistor 4 coupled in series with an N-channel drive transistor 6 between a first supply line (GNDA) and a third supply line (VDD). The drain electrodes of the P-channel and N-channel transistors 4 and 6 are coupled to the output node 8.

The gate electrode of P-channel transistor 4 is coupled to an input node 10 via an inverter 12.

The transition control circuit 2 comprises two sections 14 and 16.

Figure 7:
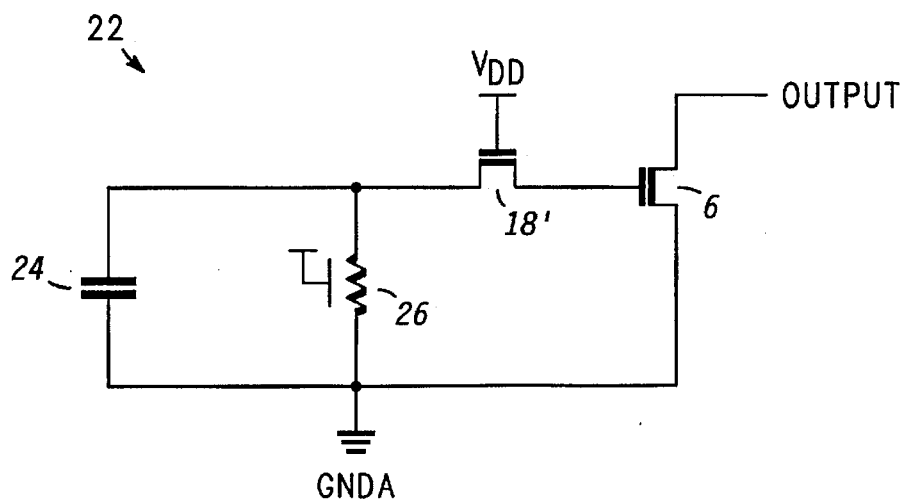
FIG. 7 is a schematic circuit diagram of part of the transition control circuit of FIG. 5.

The first section 16 comprises a NOR gate 18 having a first input coupled to the output node 8 via an inverter 20 and a resistor 19, and a second input coupled to the input node 10. It should be noted that resistor 19 is an optional element that provides voltage level shifting for inverters 20 and 28. The output of the NOR gate 18 is coupled to the gate electrode of N-channel transistor 6. The first section 16 further comprises a filter circuit 22 which is shown in more detail in FIG. 7. Briefly referring to FIG. 7, filter circuit 22 comprises a capacitor 24 coupled in parallel with a resistor 26, which in the preferred embodiment is formed by a transistor structure. It should be understood that the same reference numerals are used in the figures to denote the same elements. The resistor-capacitor arrangement is coupled between the supply line of NOR gate 18 and the first supply line GNDA via a transistor 18' which is a part of NOR gate 18 and whose gate electrode is coupled to the third supply line VDD. The drain of transistor 18' serves as an output port of filter circuit 22. Filter circuit 22 provides a filtering function to the gate terminal of transistor 6 by filtering a signal supplied via the first power supply line to the NOR gate 18, thereby producing a filtered output signal at the output of NOR gate 18.

The second section 14 comprises a NOR gate 28 having a first input coupled to an input of inverter 20, a second input coupled to the input node 10 and a third input coupled to the output of the NOR gate 18 of the first section 16. The output of the NOR gate 28 is coupled to the gate electrode of a N-channel transistor 30. The drain electrode of the N-channel transistor 30 is coupled to the output node 8 and the source electrode of the N-channel transistor 30 is coupled to a second supply line GNDB. The signal on the second supply line GNDB remains substantially constant during the transitions, since it does not supply spike current to the output node 8 for a transition.

Figure 6:
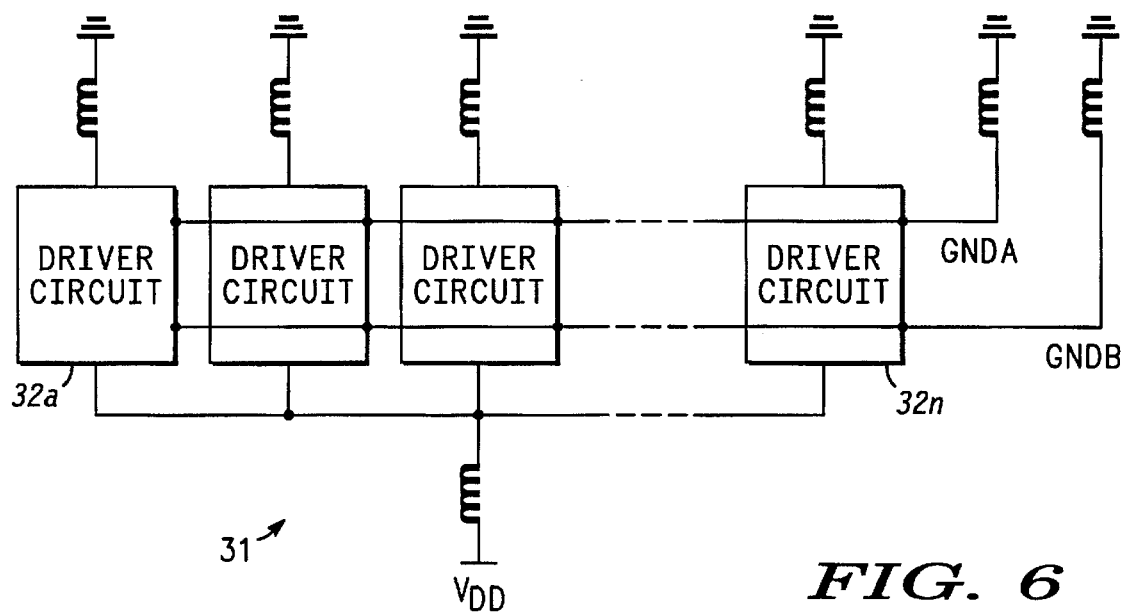
FIG. 6 is a block schematic diagram of an arrangement having a plurality of driver circuits, each comprising the transition control circuit of FIG. 5.

FIG. 6 shows an arrangement 31 of a plurality of driver circuits 32a–32n for driving a load 34, such as a capacitive load. In a bus configured arrangement, n is the bus width. Each of the driver circuits incorporates a transition control circuit in accordance with the present invention and as described above with reference to FIGS. 5 and 7. The driver circuits 32a–32n are each coupled to the first GNDA, second GNDB and third VDD supply lines.

The operation of the transition control circuit 2, which can be incorporated in such an arrangement 31, will now be described. The transition control circuit 2 of the preferred embodiment has been designed to be enabled for transitions from the logic high state to the logic low state, which is required by most systems using TTL levels. It will be appreciated, however, that the transition control circuit in accordance with the invention can be simply adapted to be enabled in response to rising edge transitions.

A signal having a voltage level corresponding to the voltage level of the third supply line VDD, is in a logic high state, and a signal having a voltage level corresponding to either the voltage level of the first GNDA or second GNDB supply lines, is in a logic low state.

The first section 16 is enabled when the signal at the output node 8 is at a logic high state, and disabled when the signal at the output node 8 is at a logic low state. Conversely, the second section 14 is enabled when the output signal is low and disabled when the output signal is high.

If we consider the situation when the signal at the input node 10 switches from a logic high state to a logic low state, the signal at the gate electrode of the P-channel transistor 4 is high, which turns this transistor 4 'off'.

When the output signal is at a logic high state, on transition of the input signal the first section 16 is enabled: the output of the NOR gate 18 is high and the N-channel transistor 6 is turned 'on'. The N-channel transistor 6 sinks current from the output node 8 and pulls the output signal to the first voltage supply level GNDA. On reaching a predetermined voltage level, the output signal switches from the logic high state to the logic low state.

Once the output signal is switched low to the first voltage supply level GNDA, the output of the NOR gate 18 goes low switching the N-channel transistor 6 'off' such that the first section 16 is disabled.

Since the output signal at the output node 8 is low, and the output of the NOR gate 18 is low, the output of NOR gate 28 is high. N-channel transistor 30 is therefore 'on' and the second section 14 is enabled. N-channel transistor 30 connects the output node 8 to the second supply line GNDB.

Figure 1:
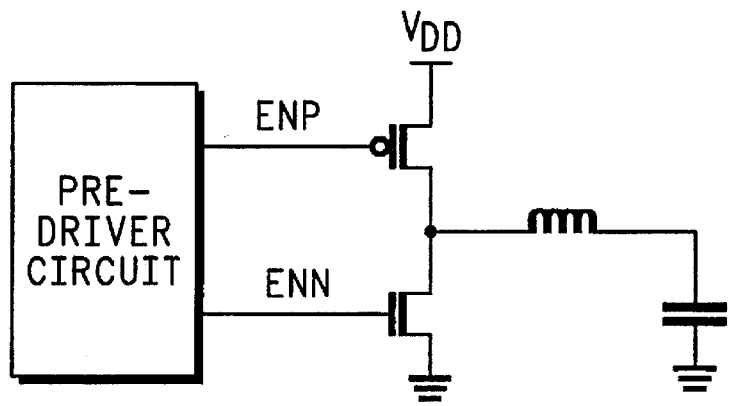
FIG. 1 is a block diagram of a prior art driver circuit.
Figure 2:
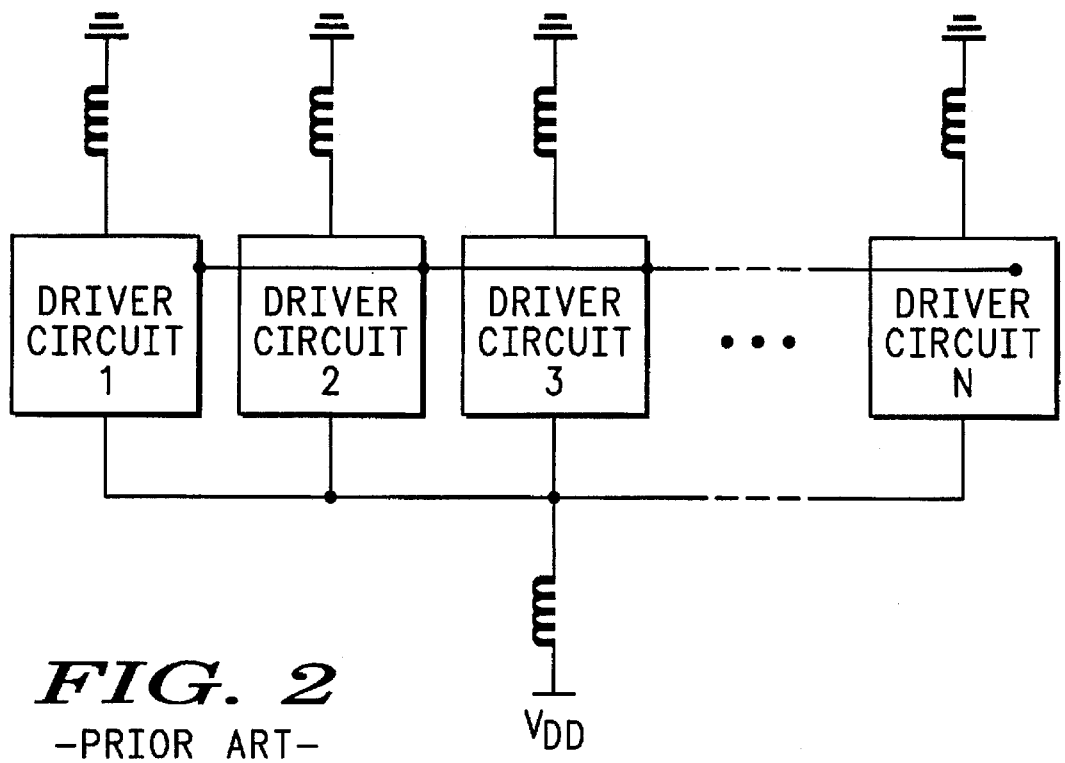
FIG. 2 is a block schematic diagram of a prior art bus configured arrangement of a plurality of driver circuits.
Figure 3:
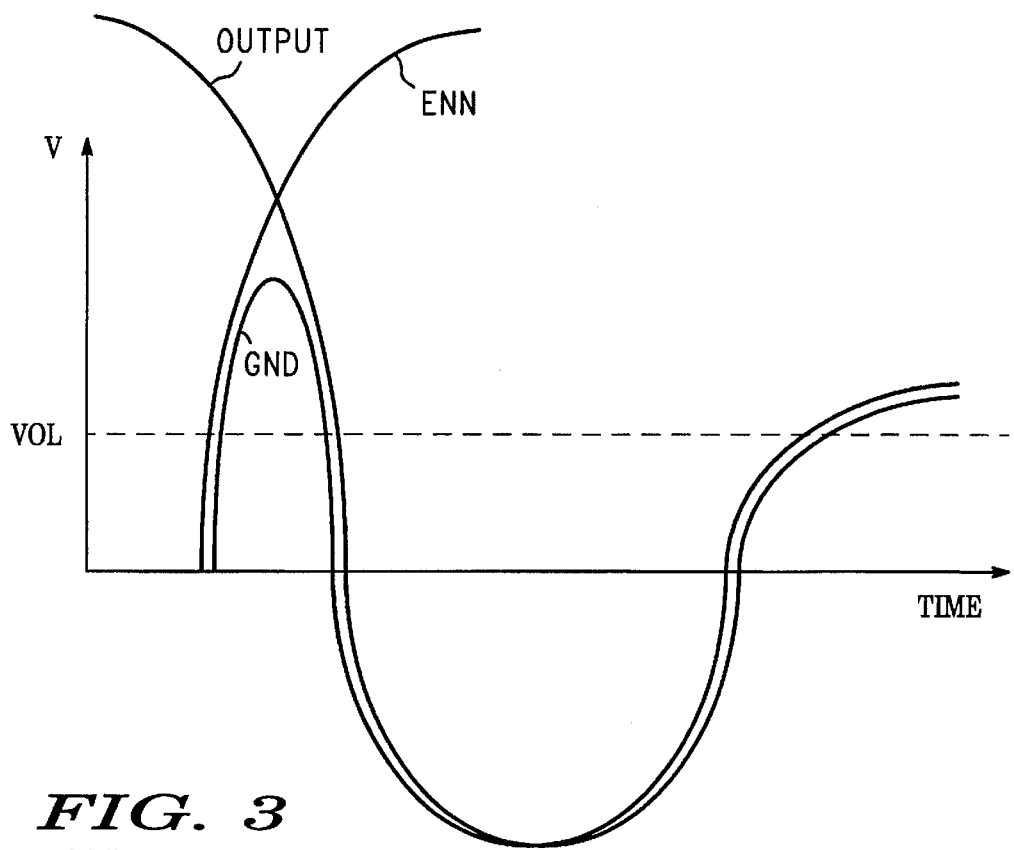
FIG. 3 is a diagrammatic representation of signals produced by a driver circuit of FIG. 2 during a transition.
Figure 4:
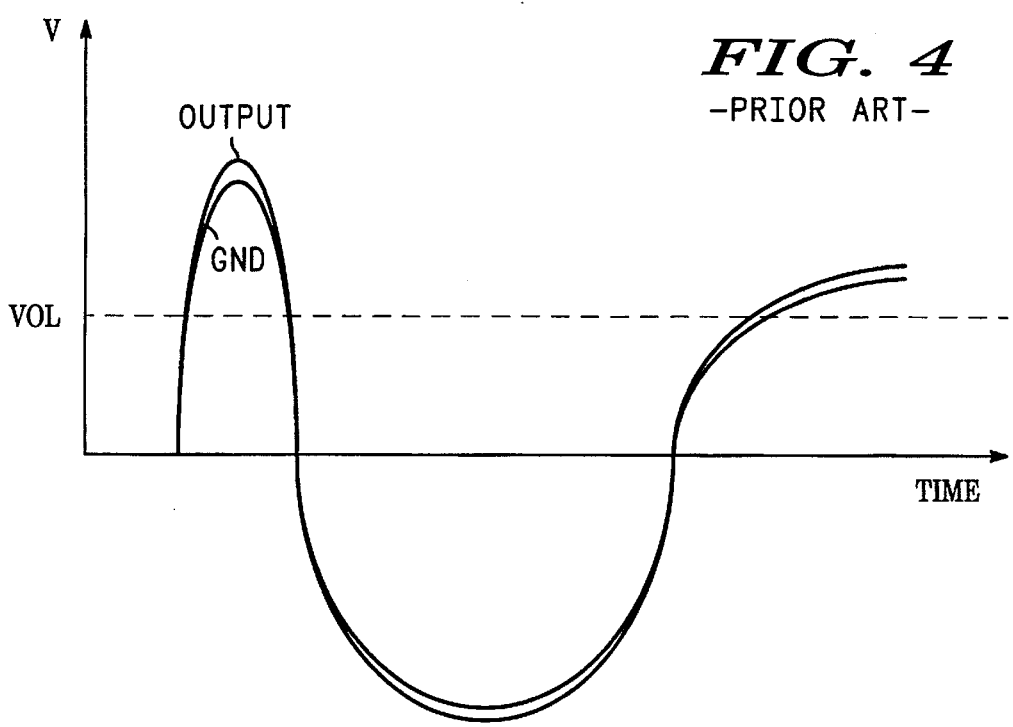
FIG. 4 is a diagrammatic representation of signals produced by a non-transient driver circuit of FIG. 2 during a transition.

As described above with reference to the prior art circuits, due to the inductance on the pin of the first supply line GNDA, the sinking of the current by N-channel transistor 6 produces a current spike and subsequent oscillations (see FIG. 3). However, the transition control circuit 2 in accordance with the present invention ensures that once the output signal has made the transition from high to low, it is tied to the second supply line GNDB, which is unaffected by spikes on the first supply line GNDA. Furthermore, the oscillations on the first supply line GNDA will not affect the output signal, since the output signal is tied to GNDB and so disconnected from GNDA whilst the oscillations occur.

By coupling the output of the NOR gate 18 to the third input of NOR gate 28, the second section is enabled only when the first section is disabled and vice versa. This ensures that there are no spikes on the second supply line GNDB.

For non-transient driver circuits in the bus configured arrangement of FIG. 6, that is driver circuits whose output signals are low before and after the transition, the first section 16 is disabled and the second section 14 enabled for the whole transition. This ensures that the output signal is tied to the second supply line GNDB for the whole transition and so not affected by the transitions in the other driver circuits.

After a transition, for non-transient and transient prior art driver circuits, the output signal is low and the signal on the first supply line GNDA oscillates as shown in FIG. 3. The signal GNDA may oscillate below the signal level on the gate electrode of N-channel drive transistor 6, which would bring this transistor into conduction. This would change the signal level at the output node 8. The preferred embodiment avoids this, by coupling the gate electrode of N-channel transistor 6 to the first supply line GNDA via NOR gate 18 and filter circuit 22. This forms a diode-connected transistor, which is in a conducting state when there are large oscillations. The filter circuit 22 coupled to the NOR gate 18 filters out the large oscillations on the first supply line GNDA, so that the output signal at the output node 8 is held in the low state.

The size of the N-channel transistor 30 does not affect the speed of transition. The size is chosen to best fit the specified sink current needed in a particular application.

Upon transition, there should be a minimum period of time when both the transistors 30 and 6 are 'on' to avoid the output being floating. This is achieved by ensuring that the delay through the NOR gate 28 is kept to a minimum.

Figure 8:
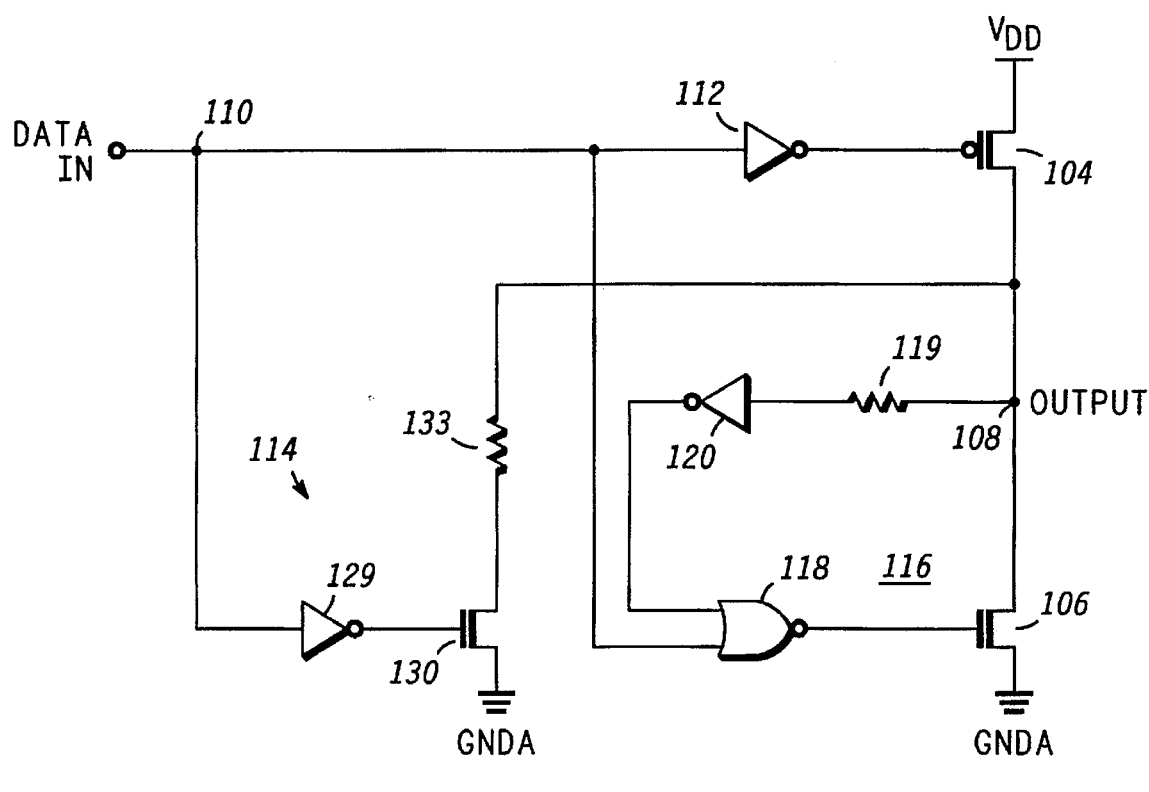
FIG. 8 is a block schematic diagram of a transition control circuit in accordance with a second embodiment of the present invention.

Referring now to FIG. 8, a transition control circuit 102 in accordance with a second embodiment of the present invention is similar to the transition control circuit 2 of FIG. 5 except that NOR gate 28 is replaced by an inverter 129, a resistor 133 is added into the path between pull-down N-channel transistor 130 and the output node 108, and the filter circuit 22 is omitted such that NOR gate 118 is connected to first supply line GNDA. Like components to those of FIG. 5 are referred to by the same reference numeral plus a hundred.

The transition control circuit 102 is connected to a first supply line GNDA and a second supply line VDD.

Figure 11:
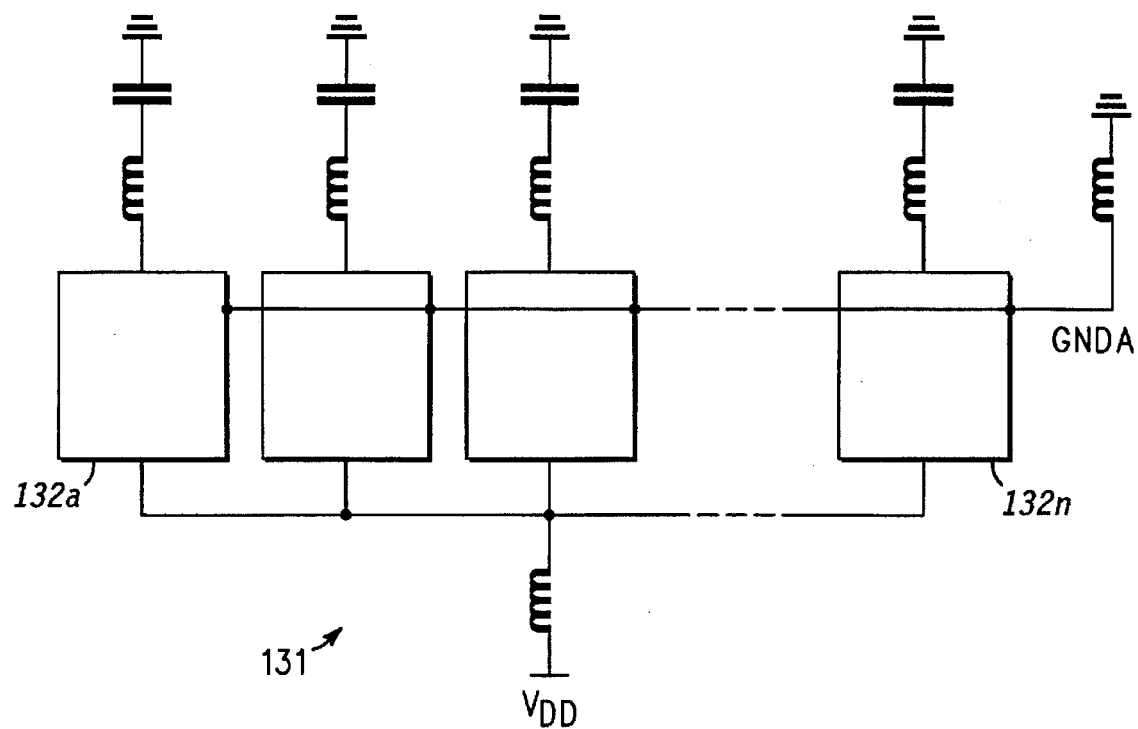
FIG. 11 is a block schematic diagram of an arrangement having a plurality of driver circuits, each comprising the transition control circuit of FIG. 8.

FIG. 11 shows an arrangement 131 of a plurality of driver circuits 132a–132n for driving a load 134, such as a capacitive load. Each of the driver circuits incorporates a transition control circuit in accordance with the second embodiment of the present invention and as described above with reference to FIG. 8. The driver circuits 132a–132n are each coupled to the first GNDA and second VDD supply lines.

The transition control circuit 102 of the preferred embodiment has been designed to be enabled for transitions from the logic high state to the logic low state, which is required by most systems using TTL levels. It will be appreciated, however, that the transition control circuit in accordance with the invention can be simply adapted to be enabled in response to rising edge transitions.

A signal having a voltage level corresponding to the voltage level of the third supply line VDD, is in a logic high state, and a signal having a voltage level corresponding to the voltage level of the first GNDA supply line, is in a logic low state.

The operation of the transition control circuit 102, which can be incorporated in such an arrangement 131 of FIG. 11, will now be described.

The first section 116 is enabled when the signal at the output node 108 is at a logic high and disabled when the signal at the output node 108 is at a logic low state. The second section 114 is enabled when the input signal is at a logic low and disabled when the input signal is at a logic high.

When there is a transition at the input node 110, that is when the signal at the input node 110 switches from a logic high state to a logic low state, the signal at the gate electrode of P-channel transistor 104 turns the transistor 104 'off' and the second section 114 is enabled.

When the output signal is at a logic high state, on transition of the input signal, the first section 116 is enabled: the output of the NOR gate 118 is high and the N-channel transistor 106 is turned 'on'. The N-channel transistor 106 sinks current from the output node 108 and pulls the output signal to the first voltage supply level GNDA. On reaching a predetermined voltage level, the output signal switches from the logic high state to the logic low state.

Once the output signal is switched low to the first voltage supply level GNDA, the output of the NOR gate 118 goes low switching the N-channel transistor 106 'off'. The first section 116 is thus disabled but the second section 114 remains enabled.

At this time, the output node 108 is connected to the first supply line GNDA via resistor 133 and N-channel transistor 130 which damps the oscillations, due to the inductance on the output pin, on the first supply line GNDA.

Figure 9:
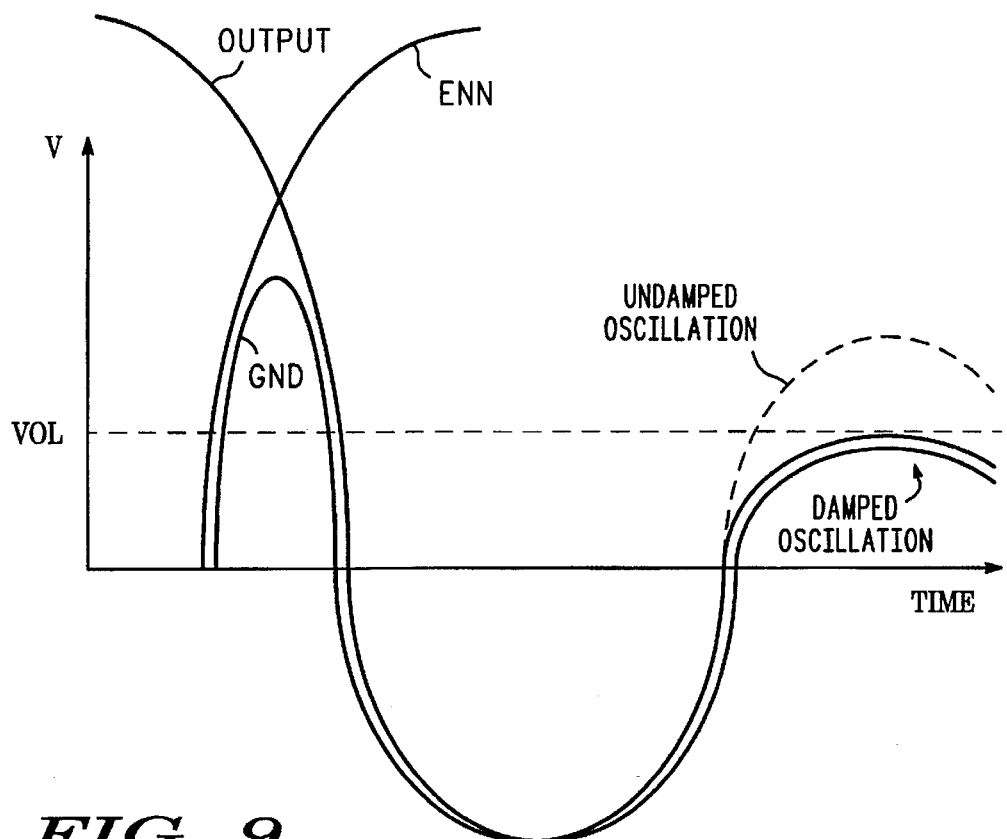
FIG. 9 is a diagrammatic representation of signals produced by a driver circuit of FIG. 8 during a transition.
Figure 10:
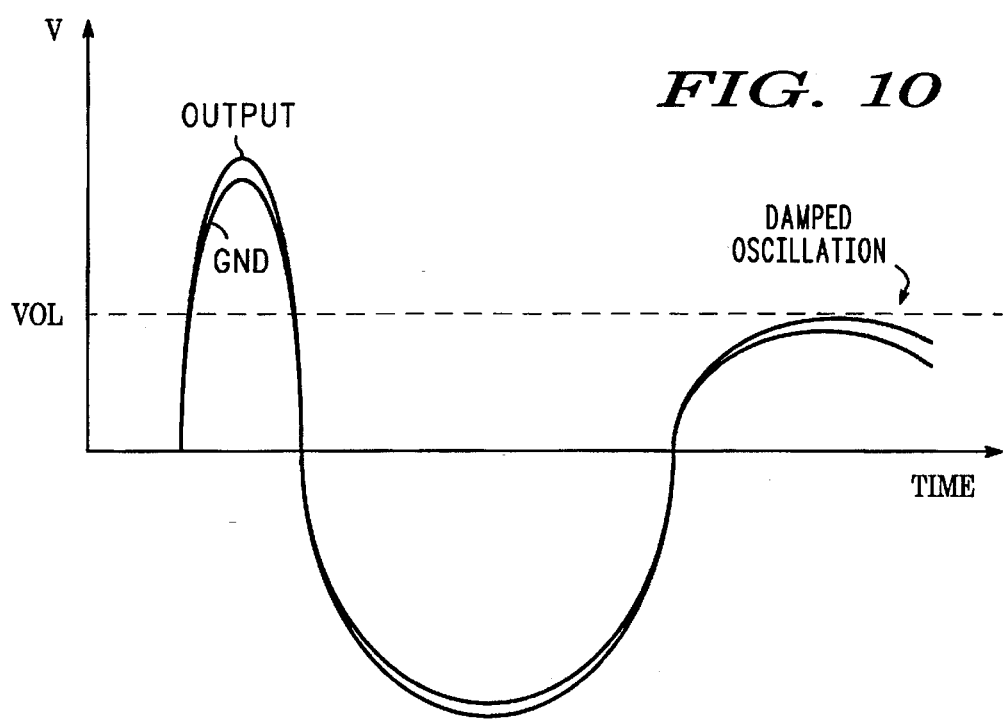
FIG. 10 is a diagrammatic representation of signals produced by a non-transient driver circuit of FIG. 8 during a transition.

This damping effect provided by the resistor 133 ensures that all the oscillations on the first supply line GNDA, apart from the initial spike at the transition time, will be below the maximum voltage level Vo1, as shown in FIGS. 9 and 10.

When the output signal is at a logic low state, on transition of the input signal, the first section 116 is disabled and the second section 114 is enabled so as to maintain the output signal at the logic low state. When enabled, the transistor 130 is 'on' and the transistor 130 and resistor 133 absorb any oscillations appearing on the first supply line GNDA.

Thus, in the bus configured arrangement of FIG. 11, the enabled second sections 114 of the non-transient driver circuits ensure that the non-transient driver circuits are unaffected by the transitions in the other driver circuits, which can cause oscillations in the common first supply line.

Although the second embodiment has been described with reference to a resistor 133 coupled between transistor 130 and output node 108, other oscillation absorbing means, such as a small transistor, can be used.

Thus, the transition control circuit 102 in accordance with the second embodiment ensures that the output signal at output node 108 does not follow the oscillations on the first supply line GNDA after a transition from a high to low state.

The transition control circuit 102 in accordance with the second embodiment uses only one low supply line GNDA as opposed to the two supply lines GNDA and GNDB used in the transition control circuit 2 of FIG. 5. Furthermore, the transition control circuit 102 is simpler requiring less components than the circuit 2 of FIG. 5.

In summary, the present invention provides rapid transition by using a large pull-down transistor (N-channel transistor 6 and N-channel transistor 106) which is switched 'off' after the transition. In the transition control circuit in accordance with the first embodiment, spike immunity is achieved by isolating the output node from the first supply line GNDA and holding the output node to a substantially constant second supply line GNDB. In the transition control circuit in accordance with the second embodiment, spike immunity is achieved by connecting the transistor 130 to the output node 108 through a resistor 133.

When the transition control circuit in accordance with the first embodiment is used in a bus configured arrangement, the transition control circuit ensures that the output of a non-transient driver circuit is connected to a substantially constant supply line GNDB, which supplies no spike current at any time.

When the transition control circuit in accordance with the second embodiment is used in a bus configured arrangement, the transition control circuit ensures that the output of a non-transient driver circuit will have a single spike at the transition time of the other driver circuits and the oscillations at the output will be damped thereafter.

We claim:

1. A transition control circuit for controlling the transitions of a signal at an output node of a driver circuit, the transition control circuit comprising:

an input node for receiving an input signal having a first logic state or a second logic state, an output signal at the output node being switchable between the first logic state and the second logic state in dependence on the logic state of the input signal;

first means coupled to the output node and the input node, wherein the first means comprises:

a logic circuit having at least one input and at least one output, the at least one output coupled to the driver circuit; and filter means coupled between the logic circuit and a first supply line for filtering predetermined oscillations from the signal supplied by the first supply line, the first means being enabled when the output signal has the first logic state and the input signal has the second logic state, and being disabled when the output signal has the second logic state or the input signal has the first logic state, the first means once enabled coupling the output node to the first supply line such that the output signal at the output node switches to the second logic state when the voltage at the output node reaches a predetermined level; and second means coupled to the output node and the input node and being enabled when the output signal has the second logic state and the input signal has the second logic state, and being disabled when the output signal has the first logic state or the input signal has the first logic state, the second means once enabled coupling the output node to a second supply line such that the output signal is held in the second logic state until the next transition of the input signal.

2. A transition control circuit as claimed in claim 6 wherein the driver circuit comprises a first drive transistor and a second drive transistor coupled in series, wherein the first current electrodes of the first and second drive transistors are coupled to the output node, the second current electrode of the second drive transistor is coupled to the first supply line and the second current electrode of the first drive transistor is coupled to a third supply line, wherein the control electrode of the second drive transistor is coupled to the at least one output of the logic circuit and the control electrode of the first drive transistor is coupled to the the at least one input via inverting means such that when the input signal has the first logic state the first drive transistor is conducting and the output node is at the level of the third supply line and when the input signal has the second logic state the first drive transistor is non-conducting and the output node is at either the level of the first or second supply line in response to the first means or second means being enabled respectively.

3. A transition control circuit as claimed in claim 2 wherein the first means comprises:

inverting means having an input coupled to the output node and an output;

a NOR gate which serves as the logic circuit, wherein the at least one input of the logic circuit comprises a first input coupled to the output of the inverting means and a second input coupled to the input node, and the at least one output is an output coupled to the control electrode of the second drive transistor, such that when the output signal has the first logic state and the input signal has the second logic state, the drive transistor is conducting and when either the output signal has the second logic state or the input signal has the first logic state the second drive transistor is non-conducting.

4. A transition control circuit according to claim 3 wherein the second means comprises:

a transistor having a first current electrode coupled to the output node and a second current electrode coupled to the second supply line; and logic means coupled to the input node and the output node, the logic means providing a signal to the control electrode of the transistor such that when the output signal has the second logic state and the input signal has the second logic state, the transistor is conducting and the output node is at the level of the second supply line and when either the output signal or the input signal has the first logic state the transistor is non-conducting.

5. A transition control circuit according to claim 4 wherein the output of the NOR gate is coupled to the logic means of the second means so that the second means is enabled when the second drive transistor is non-conducting.

6. A transition control circuit according to claim 4 wherein the logic means comprises a NOR logic gate.

7. An arrangement comprising a plurality of driver circuits for driving a plurality of capacitive loads and having common supply lines, each one of the driver circuits having a transition control circuit for controlling the transitions of a signal at an output node of the driver circuit, the transition control circuit comprising:

an input node for receiving an input signal having a first logic state or a second logic state, the output signal at the output node being switchable between the first logic state and the second logic state in dependence on the logic state of the input signal;

first means coupled to the output node and the input node, wherein the first means comprises:

a logic element having at least one input and at least one output, the at least one output coupled to the output node; and filter means coupled between the logic element and the first supply line for filtering predetermined oscillations from the signal supplied by the first supply line, the first means being enabled when the output signal has the first logic state and the input signal has the second logic state, and being disabled when the output signal has the second logic state or the input signal has the first logic state, the first means once enabled coupling the output node to a first supply line such that the output signal at the output node switches to the second logic state when the voltage at the output node reaches a predetermined level; and second means coupled to the output node and the input node and being enabled when the output signal has the second logic state and the input signal has the second logic state, and being disabled when the output signal has the first logic state or the input signal has the first logic state, the second means once enabled coupling the output node to a second supply line such that the output signal is held in the second logic state until the next transition of the input signal.

8. An arrangement as claimed in claim 7 wherein each driver circuit comprises a first drive transistor and a second drive transistor coupled in series, wherein the first current electrodes of the first and second drive transistors are coupled to the output node, the second current electrode of the second drive transistor is coupled to the first supply line and the second current electrode of the first drive transistor is coupled to a third supply line, wherein the control electrode of the second drive transistor is coupled to the at least one output of the logic element and the control electrode of the first drive transistor is coupled to the input node via inverting means such that when the input signal has the first logic state the first drive transistor is conducting and the output node is at the level of the third supply line and when the input signal has the second logic state the first drive transistor is non-conducting and the output node is at either the level of the first or second supply line in response to the first means or second means being enabled respectively.

9. An arrangement as claimed in claim 8 wherein the first means comprises:

inverting means having an input coupled to the output node and an output;

NOR gate means having a first input coupled to the output of the inverting means and a second input coupled to the input node and an output coupled to the control electrode of the second drive transistor, such that when the output signal has the first logic state and the input signal has the second logic state, the drive transistor is conducting and when either the output signal has the second logic state or the input signal has the first logic state the second drive transistor is non-conducting.

10. An arrangement as claimed in claim 9 wherein the second means comprises:

a transistor having a first current electrode coupled to the output node and a second current electrode coupled to the second supply line; and logic means coupled to the input node and the output node, the logic means providing a signal to the control electrode of the transistor such that when the output signal has the second logic state and the input signal has the second logic state, the transistor is conducting and the output node is at the level of the second supply line and when either the output signal or the input signal has the first logic state the transistor is non-conducting.

11. An arrangement as claimed in claim 10 wherein the output of the NOR gate means is coupled to the logic means of the second means so that the second means is enabled when the second drive transistor is non-conducting.

12. A transition control circuit for controlling the transitions of a signal at an output node of a driver circuit comprising:

an input node for receiving an input signal having a first logic state or a second logic state, the signal at the output node being switchable between the first logic state and the second logic state in dependence on the logic state of the input signal;

a driver circuit, the driver circuit comprising:

a first drive transistor and a second drive transistor coupled in series, wherein the first and second drive transistors have first and second current conducting electrodes and a control electrode, the first current conducting electrodes of the first and second drive transistors coupled to the output node, the second current conducting electrode of the second drive transistor coupled to the first supply line, and the second current conducting electrode of the first drive transistor coupled to a second supply line, and wherein the control electrode of the first drive transistor is coupled to the input node via inverting means such that when the input signal has the first logic state the first drive transistor is conducting and the output node is at the level of the second supply line and when the input signal has the second logic state the first drive transistor is non-conducting and the output node is at the level of the first supply line;

first means coupled to the output node and the input node, wherein the first means comprises inverting means having an input coupled to the output node and an output, and a NOR gate means having a first input coupled to the output of the inverting means and a second input coupled to the input node and an output coupled to the control electrode of the second drive transistor, such that when the output signal has the first logic state and the input signal has the second logic state, the drive transistor is conducting and when either the output signal has the second logic state or the input signal has the first logic state the second drive transistor is non-conducting, and the first means being enabled when the output signal has the first logic state and the input signal has the second logic state, and being disabled when the output signal has the second logic state or the input signal has the first logic state, the first means once enabled coupling the output node to a first supply line such that the output signal at the output node switches to the second logic state when the voltage at the output node reaches a predetermined level; and second means coupled to the output node, the input node and the first supply line, and being enabled when the input signal has the second logic state and being disabled when the input signal has the first logic state, the second means comprising resistive means coupled between the output node and the first supply line, the second means coupling the output node to the first supply line via the resistive means when the second means is enabled and the first means is disabled, such that the output signal is held in the second logic state until the next transition of the input signal.

13. A transition control circuit according to claim 12 wherein the second means comprises:

a transistor having a first current electrode coupled to the output node via the resistive means and a second current electrode coupled to the first supply line; and an inverter coupled between the input node and the control electrode of the transistor, wherein the transistor is non-conducting when the input signal has the first logic state and the transistor is conducting when the input signal has the second logic state.

14. A transition control circuit according to claim 12 wherein the resistive means comprises a resistor.

15. An arrangement comprising:

an input node for receiving an input signal having a first logic state or a second logic state;

a plurality of driver circuits for driving a plurality of capacitive loads and having common supply lines, each one of the driver circuits having a transition control circuit for controlling the transitions of a signal at an output node of the driver circuit, wherein the signal at the output node of the driver circuit is switchable between the first logic state and the second logic state in dependence on the logic state of the input signal, and wherein each driver circuit comprises a first drive transistor and a second drive transistor coupled in series, the first and second drive transistors each having first and second current conducting electrodes and a control electrode, the current conducting electrodes of the first and second drive transistors coupled to the output node, the second current conducting electrode of the second drive transistor coupled to the first supply line, the second current conducting electrode of the first drive transistor coupled to a second supply line, the control electrode of the first drive transistor coupled to the input node via inverting means such that when the input signal has the first logic state the first drive transistor is conducting and the output node is at the level of the second supply line and when the input signal has the second logic state the first drive transistor is non-conducting and the output node is at the level of the first supply line;

first means coupled to the output node and the input node, wherein the first means comprises inverting means having an input coupled to the output node and an output, and NOR gate means having a first input coupled to the output of the inverting means and a second input coupled to the input node and an output coupled to the control electrode of the second drive transistor, such that when the output signal has the first logic state and the input signal has the second logic state, the drive transistor is conducting and when either the output signal has the second logic state or the input signal has the first logic state the second drive transistor is non-conducting, the first means being enabled when the output signal has the first logic state and the input signal has the second logic state, and being disabled when the output signal has the second logic state or the input signal has the first logic state, the first means once enabled coupling the output node to a first supply line such that the output signal at the output node switches to the second logic state when the voltage at the output node reaches a predetermined level; and second means coupled to the output node, the input node and the first supply line, and being enabled when the input signal has the second logic state and being disabled when the input signal has the first logic state, the second means comprising resistive means coupled between the output node and the first supply line, the second means coupling the output node to the first supply line via the resistive means when the second means is enabled and the first means is disabled, such that the output signal is held in the second logic state until the next transition of the input signal.

16. An arrangement as claimed in claim 15 wherein the second means comprises:

a transistor having a first current electrode coupled to the output node via the resistive means and a second current electrode coupled to the first supply line; and an inverter coupled between the input node and the control electrode of the transistor, wherein the transistor is non-conducting when the input signal has the first logic state and the transistor is conducting when the input signal has the second logic state.

17. An arrangement as claimed in claim 15 wherein the resistive means comprises a resistor.

* * * * *